(12) United States Patent
Michalak et al.

(10) Patent No.: US 10,748,961 B2
(45) Date of Patent: Aug. 18, 2020

(54) INTERCONNECTS BELOW QUBIT PLANE BY SUBSTRATE BONDING

(71) Applicant: Intel Corporation, Santa Clara, CA (US)

(72) Inventors: David J. Michalak, Portland, OR (US); Ravi Pillarisetty, Portland, OR (US); Zachary R. Yoscovits, Beaverton, OR (US); Jeanette M. Roberts, North Plains, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/307,979

(22) PCT Filed: Jul. 1, 2016

(86) PCT No.: PCT/US2016/040603
§ 371 (c)(1),
(2) Date: Dec. 7, 2018

(87) PCT Pub. No.: WO2018/004636
PCT Pub. Date: Jan. 4, 2018

(65) Prior Publication Data
US 2019/0305038 A1    Oct. 3, 2019

(51) Int. Cl.
*H01L 27/18* (2006.01)
*G06N 10/00* (2019.01)
(Continued)

(52) U.S. Cl.
CPC ............. *H01L 27/18* (2013.01); *G06N 10/00* (2019.01); *H01L 23/5226* (2013.01);
(Continued)

(58) Field of Classification Search
CPC ..... H01L 27/18; H01L 23/5226; H01L 23/66; H01L 39/025; H01L 39/223;
(Continued)

(56) References Cited

U.S. PATENT DOCUMENTS

| | | | |
|---|---|---|---|
| 4,176,290 A | 11/1979 | Ishida et al. | |
| 6,678,540 B2 * | 1/2004 | Wire | H01P 1/047 333/247 |

(Continued)

FOREIGN PATENT DOCUMENTS

| | | |
|---|---|---|
| JP | 2010511293 | 4/2010 |
| WO | 2008064491 A1 | 6/2008 |

(Continued)

OTHER PUBLICATIONS

"A surface code quantum computer in silicon," Charles D. Hill, et al., Science Advances vol. 1, No. 9, e1500707, Oct. 30, 2015.
(Continued)

*Primary Examiner* — Dzung Tran
(74) *Attorney, Agent, or Firm* — Patent Capital Group

(57) ABSTRACT

Described herein are structures that include interconnects for providing electrical connectivity in superconducting quantum circuits. One structure includes a first and a second interconnects provided over a surface of an interconnect support layer, e.g. a substrate, on which superconducting qubits are provided, a lower interconnect provided below such surface (i.e. below-plane interconnect), and vias for providing electrical interconnection between the lower interconnect and each of the first and second interconnects. Providing below-plane interconnects in superconducting quantum circuits allows realizing superconducting and mechanically stable interconnects. Implementing below-plane interconnects by bonding of two substrates, material for which could be selected, allows minimizing the amount (Continued)

of spurious two-level systems in the areas surrounding below-plane interconnects while allowing different choices of materials to be used. Methods for fabricating such structures are disclosed as well.

20 Claims, 11 Drawing Sheets

(51) Int. Cl.

| | | |
|---|---|---|
| *H01L 23/522* | (2006.01) | |
| *H01L 23/66* | (2006.01) | |
| *H01L 39/02* | (2006.01) | |
| *H01L 39/22* | (2006.01) | |
| *H01L 39/24* | (2006.01) | |

(52) U.S. Cl.
CPC ............ *H01L 23/66* (2013.01); *H01L 39/025* (2013.01); *H01L 39/223* (2013.01); *H01L 39/2406* (2013.01); *H01L 39/2416* (2013.01); *H01L 39/2493* (2013.01); *H01L 2223/6627* (2013.01)

(58) Field of Classification Search
CPC ............ H01L 39/2406; H01L 39/2416; H01L 39/2493; H01L 2223/6627; G06N 10/00
USPC .......................................................... 257/31
See application file for complete search history.

(56) References Cited

U.S. PATENT DOCUMENTS

| | | | |
|---|---|---|---|
| 8,610,453 B2 | 12/2013 | Herr | |
| 8,654,578 B2 | 2/2014 | Lewis et al. | |
| 2003/0111661 A1 | 6/2003 | Tzalenchuk et al. | |
| 2004/0173787 A1 | 9/2004 | Blais et al. | |
| 2006/0197193 A1* | 9/2006 | Gu .................... | H01L 23/53285 257/661 |
| 2009/0173936 A1 | 7/2009 | Bunyk | |
| 2011/0057169 A1 | 3/2011 | Harris et al. | |
| 2012/0074386 A1 | 3/2012 | Rachmady et al. | |
| 2012/0187378 A1 | 7/2012 | Bonderson et al. | |
| 2012/0319085 A1* | 12/2012 | Gambetta ............... | H01L 39/04 257/31 |
| 2014/0235450 A1 | 8/2014 | Chow et al. | |
| 2014/0264285 A1 | 9/2014 | Chow et al. | |
| 2014/0264286 A1 | 9/2014 | Chang et al. | |
| 2016/0079968 A1 | 3/2016 | Strand et al. | |
| 2016/0148112 A1 | 5/2016 | Kwon | |
| 2016/0300155 A1* | 10/2016 | Betz .................... | H01L 29/0673 |
| 2017/0098627 A1* | 4/2017 | Das .................... | H01L 25/0657 |
| 2018/0004635 A1 | 1/2018 | Murthy | |
| 2018/0069288 A1* | 3/2018 | Minev .................... | G06N 10/00 |
| 2018/0366634 A1* | 12/2018 | Mutus .................... | H01L 25/50 |

FOREIGN PATENT DOCUMENTS

| | | |
|---|---|---|
| WO | 2015013532 A1 | 1/2015 |
| WO | 2016069032 A1 | 5/2016 |
| WO | 2018004634 A1 | 1/2018 |
| WO | 2018004635 A1 | 1/2018 |
| WO | 2018004636 A1 | 1/2018 |
| WO | 2018063168 A1 | 4/2018 |

OTHER PUBLICATIONS

"An opto-magneto-mechanical quantum interface between distant superconducting qubits," Keyu Xia et al., Scientific Reports 4, Article No. 5571, Jul. 4, 2014.

"Concentric Transmon qubit featuring fast turnability and an anisotropic magnetic dipole moment," Braumuller et al., Applied Physics Letters, 108:3, Jan. 2016.

"Cryogenic Control Architecture for Large-Scale Quantum Computing," Hornibrook, J.M., et al., arXiv:1409.2202v1 [cond-mat.res-hall] Sep. 8, 2014; 8 pages.

"Embracing the quantum limit in silicon computing," Morton et al, Macmillan Publishers, Nov. 17, 2011, vol. 479, Nature, pp. 345-353.

"Fabrication and Characterization of Aluminum Airbridges for Superconducting Microwave Circuits," Chen, Zijun, et al., arXiv:1310.2325v1 [condo-mat.mes-hall] Oct. 9, 2013, 8 pages.

"Independent, extensible control of same-frequency superconducting qubits by selective broadcasting," Asaad et al., Netherlands Organisation for Applied Scientific Research, Aug. 28, 2015, 17 pages.

"Magnetic field tuning of coplanar waveguide resonators," Healey, et al., Applied Physics Letters 93, 043513 (2008), pp. 043513-1 through 3 (4 pages with cover sheet).

"Multilayer microwave integrated quantum circuits for scalable quantum computing," Brecht et al, Department of Applied Physics, Yale University, Sep. 4, 2015, 5 pages.

"Reducing intrinsic loss in superconducting resonators by surface treatment and deep etching of silicon substrates," Bruno, et al., QuTech Advanced Research Center and Kavli Institute of Nanoscience, Delft University of Technology, the Netherlands, Feb. 16, 2015, 9 pages.

"Scalable quantum circuit and control for a superconducting surface code," Versluis et al, Netherlands Organisation for Applied Scientific Research, Dec. 28, 2016, 9 pages.

"Surface loss simulations of superconducting coplanar waveguide resonators," Wenner et al, Applied Physics Letters 99, 113513 (2011), pp. 113513-1 through 113513-3.

"Suspending superconducting qubits by silicon micromachining," Chu et al., Department of Applied Physics, Yale University, Jun. 10, 2016, 10 pages.

International Search Report and Written Opinion in International Patent Application No. PCT/US2016/040601 dated Mar. 31, 2017, 8 pages.

International Search Report and Written Opinion in International Patent Application No. PCT/US2016/040602 dated Mar. 31, 2017, 8 pages.

International Search Report and Written Opinion in International Patent Application No. PCT/US2016/040603 dated Apr. 28, 2017; 11 pages.

International Search Report and Written Opinion in International Patent Application No. PCT/US2016/054039 dated May 24, 2017; 12 pages.

International Search Report and Written Opinion in International Patent Application No. PCT/US2017/024396 dated Dec. 15, 2016, 9 pages).

\* cited by examiner

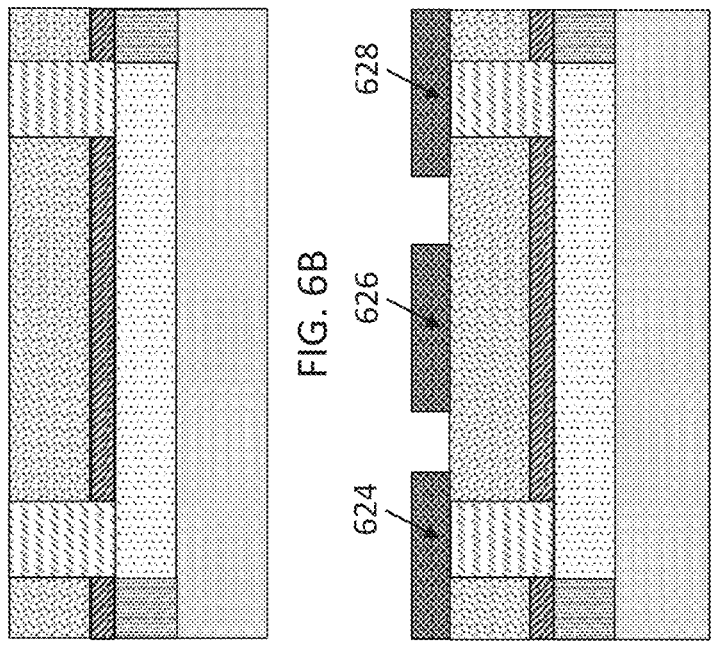
FIG. 6A  FIG. 6B
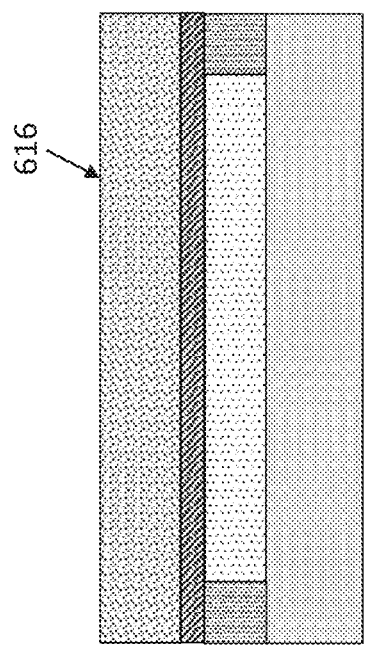 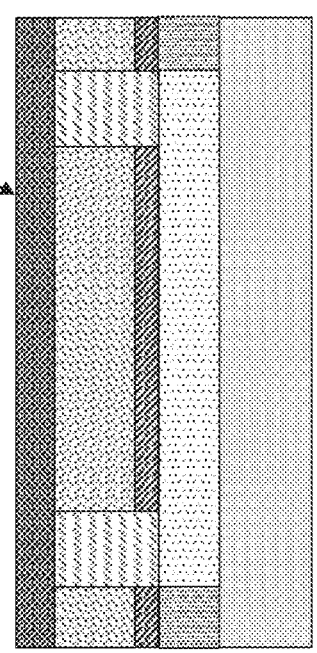
FIG. 6C  FIG. 6D
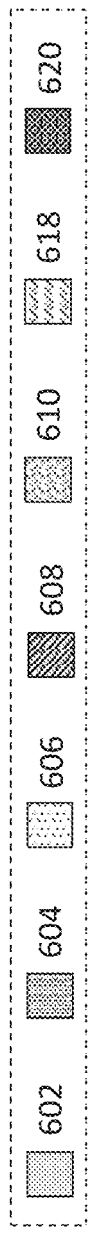

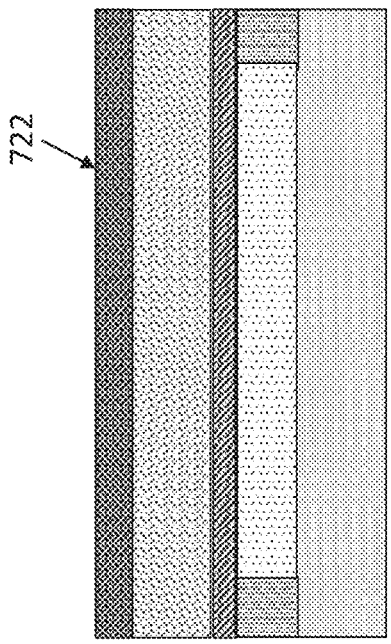
FIG. 7B
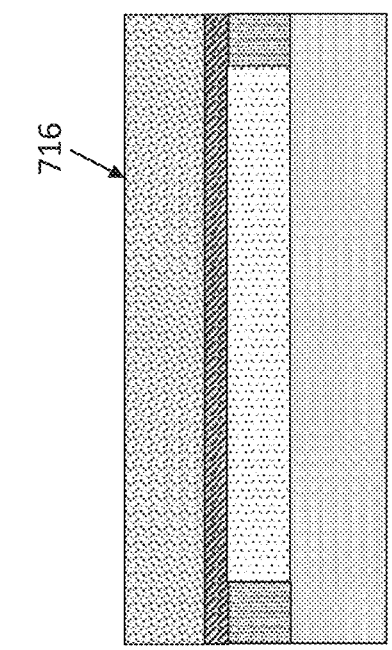
FIG. 7A
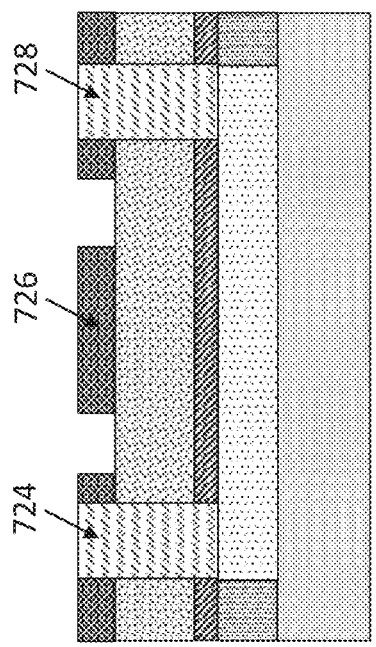
FIG. 7D
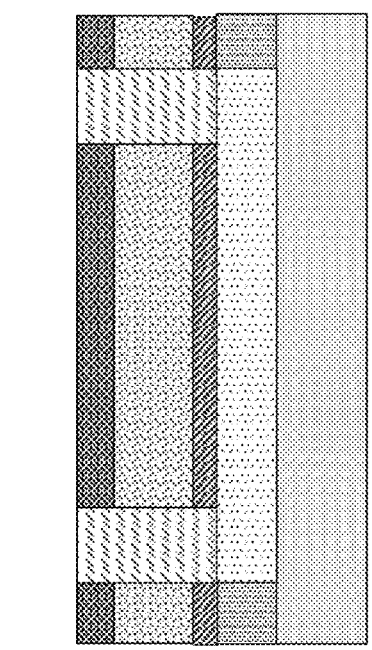
FIG. 7C

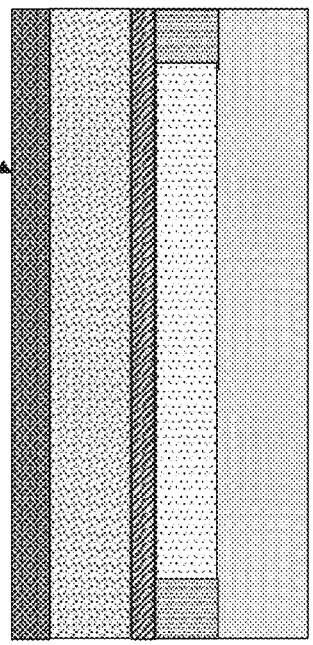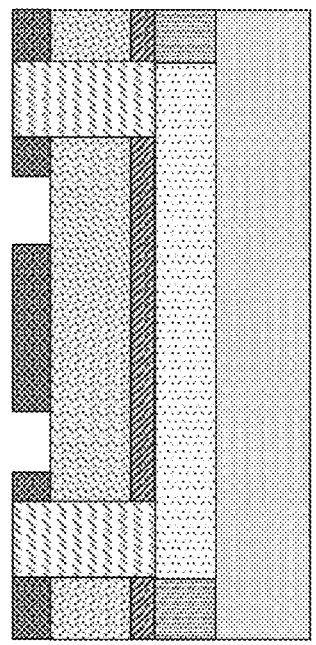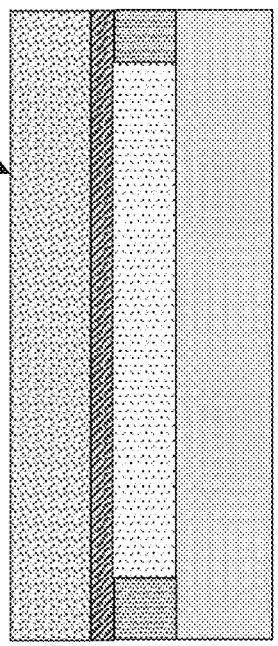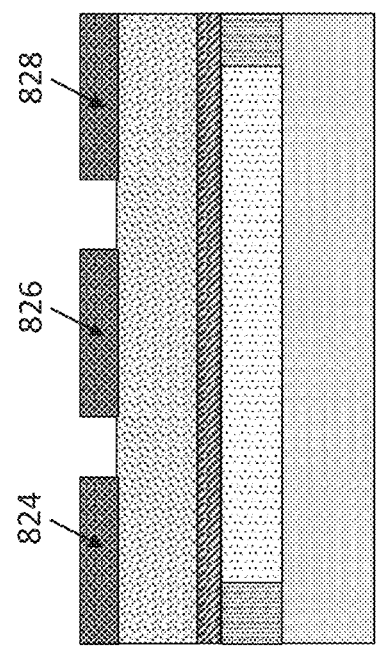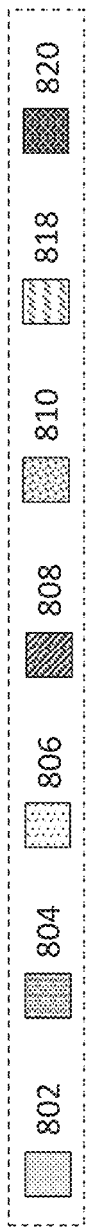

# US 10,748,961 B2

INTERCONNECTS BELOW QUBIT PLANE BY SUBSTRATE BONDING

CROSS-REFERENCE TO RELATED APPLICATION

This Application is a national stage application under 35 U.S.C. § 371 of PCT Application PCT/US2016/040603, filed Jul. 1, 2016, and entitled "INTERCONNECTS BELOW QUBIT PLANE BY SUBSTRATE BONDING," which is hereby incorporated by reference in its entirety.

TECHNICAL FIELD

This disclosure relates generally to the field of quantum computing, and more specifically, to interconnects for use in superconducting quantum circuits and to methods of fabricating such interconnects.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 6A-6D illustrate implementation of box 408 of the method shown in FIG. 4, according to a first embodiment of the present disclosure.

FIGS. 7A-7D illustrate implementation of box 408 of the method shown in FIG. 4, according to a second embodiment of the present disclosure.

FIGS. 8A-8D illustrate implementation of box 408 of the method shown in FIG. 4, according to a third embodiment of the present disclosure.

DETAILED DESCRIPTION

Figure 1A:
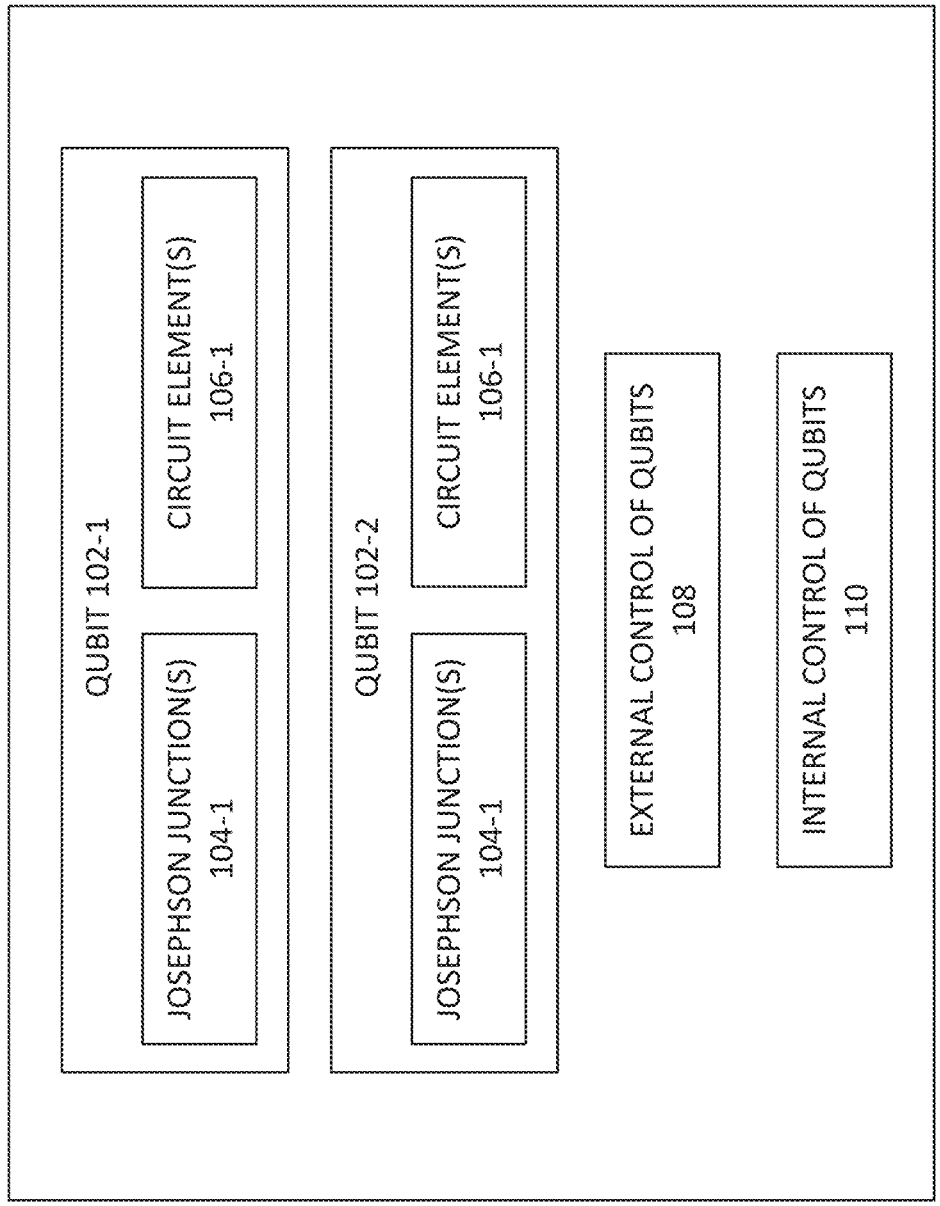
FIG. 1A provides a schematic illustration of a superconducting quantum circuit, according to some embodiments of the present disclosure.

As previously described herein, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from that of classical computers (i.e. computers that use phenomena of classical physics). Classical computers encode data into binary values, commonly referred to as bits. At any given time, a bit is always in only one of two states—it is either 0 or 1. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Compared to well-established and thoroughly researched classical computers, quantum computing is still in its infancy, with the highest number of qubits in a solid-state quantum processor currently being about 10. One of the main challenges resides in protecting qubits from decoherence so that they can stay in their information-holding states long enough to perform the necessary calculations and read out the results. For this reason, materials, structures, and fabrication methods used for building qubits should continuously focus on reducing spurious (i.e. unintentional and undesirable) two-level systems (TLS's), thought to be the dominant source of qubit decoherence. In general, as used in quantum mechanics, a two-level (also referred to as "two-state") system is a system that can exist in any quantum superposition of two independent and physically distinguishable quantum states. Also for the reason of protection from decoherence, qubits are often operated at cryogenic temperatures, typically just a few degrees or even just a few millidegrees above absolute zero because cryogenic temperatures minimize the detrimental effects of spurious TLS's. None of these challenges ever had to be addressed for classical computers.

As the foregoing illustrates, ability to manipulate and read out quantum states, making quantum-mechanical phenomena visible and traceable, and ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. superconducting qubits, single trapped ion qubits, Silicon (Si) quantum dot qubits, photon polarization qubits, etc.

Out of the various physical implementations of qubits listed above, superconducting qubits are promising candidates for building a quantum computer. Advantageously, because excitation energy of superconducting qubits is controlled by the circuit elements, these qubits can be designed to have any frequency. Typically, frequencies of such qubits are in 5-10 gigahertz (GHz) range, in order to be higher than thermal excitations, but low enough for ease of microwave engineering.

Interconnects used in quantum circuits employing superconducting qubits to provide electrical connectivity between different circuit elements need to be superconducting and mechanically stable. In addition, in order for such quantum circuits to operate with sufficient stability (i.e. no or minimal decoherence), areas of quantum circuits that surround interconnects should be as free of spurious TLS's as possible. An adequate balance between all of these requirements is difficult to achieve in practice. Therefore, improvements with respect to providing interconnects in superconducting quantum circuits are always desirable.

As the foregoing description illustrates, building a quantum computer presents unique challenges not encountered in classical computing. The challenges are unique due to, both, the physics of data manipulation being different from that of classical computers (e.g. superposition, entanglement, and collapse), and the physical systems suitable to build quantum circuits of a quantum computer being different (e.g. the systems should be able to provide substantially lossless connectivity and be able to operate at cryogenic temperatures). Described herein are structures that include interconnects to be used in quantum circuit components, and methods for fabricating such structures.

Described herein are structures that include interconnects for providing electrical connectivity in superconducting quantum circuits. In one aspect of the present disclosure, a structure includes a first and a second interconnects provided over a surface of an interconnect support layer on which superconducting qubits are provided, a lower interconnect provided below the surface of the interconnect support layer, and vias for providing electrical interconnection between the lower interconnect and each of the first and second interconnects. The lower interconnect may include any superconductive material, including materials which are different from highly doped versions of the material of the interconnect support layer. The interconnect support layer could be a substrate, e.g. a wafer on which the quantum circuit is provided, or could be a layer provided, or to be provided, over such a substrate. Therefore, in the following, unless specified otherwise, the terms "interconnect support layer" and "substrate" may be used interchangeably. As used herein, the term "in-plane interconnect" is used to describe interconnects provided over the surface of an interconnect support layer on which a quantum circuit with a plurality of superconducting qubits is provided (i.e. such interconnects may be considered to be in-plane with the superconducting qubits). On the other hand, the term "below-plane interconnect" is used to describe interconnects provided below the surface of an interconnect support layer (i.e. such interconnects may be considered to be below the plane of the superconducting qubits). Providing below-plane interconnects in superconducting quantum circuits allows realizing superconducting and mechanically stable interconnects. Implementing below-plane interconnects by bonding of two substrates, material for which could be selected, allows minimizing the amount of spurious TLS's in the areas surrounding the qubit and its resonators while allowing different choices of suitable materials for forming below-plane interconnects. Methods for fabricating such structures are disclosed as well.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Furthermore, in the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation. Operations described may be performed in a different order from the described embodiment(s). Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

As used herein, terms indicating what may be considered an idealized behavior, such as e.g. "superconducting" or "lossless", are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. One metric of interest may be the decay rate associated with these losses (e.g. losses either from TLS's or residual resistance), and as long as the decay rate associated with these mechanisms is not worse than needed in order to achieve a fault-tolerant quantum calculation, then the losses are deemed acceptable and the idealized terms (e.g. superconducting or lossless)—appropriate. Specific values associated with an acceptable decay are expected to change over time as fabrication precision will improve and as fault-tolerant schemes may become more tolerant of higher decay rates. An adapted version of this metric, as well as other metrics suitable for a particular application in determining whether certain behavior may be referred to using idealized terms, are within the scope of the present disclosure.

As previously briefly explained above, quantum computing refers to the use of quantum mechanical properties to perform calculations. Some of these properties include superposition and entanglement. Just as classical computers are composed of bits that can either be in a 1 or a 0 state, a quantum computer is composed of quantum bits (i.e., qubits) which have states of $|0\rangle$ and $|1\rangle$. Quantum mechanics allows for superpositions of the $|0\rangle$ and $|1\rangle$ states with a general form of $a|0\rangle+b|1\rangle$ where a and b are complex numbers. When a qubit state is measured, it collapses to either state $|0\rangle$ with a probability of that happening being $|a|^2$, or to state $|1\rangle$ with a probability of the latter being $|b|^2$. Taking into account the fact that $|a|^2+|b|^2=1$ (since the total probability must sum to unity) and ignoring an overall phase factor which does not have any observable effects, the general state can be re-written as cos $$\frac{\theta}{2}|0\rangle + e^{i\varphi}\sin\frac{\theta}{2}|1\rangle,$$

where $\varphi$ is the phase difference between the two states.

Entanglement occurs when the interaction between two particles (e.g. two qubits) is such that the states of the two cannot be specified independently, but rather can only be specified for the whole system. This causes the states of the two qubits to be linked together such that measurement of one of the qubits, causes the state of the other qubit to collapse.

In order to realize a quantum computer, a physical system that can act as a qubit is needed. Such a system needs to have at least two states to act as 0 and 1 states. Note that it is not necessary to have a system with exactly only two states if the spacing between each energy level is different, such that each level can be addressed individually. As previously described herein, one type of physical system that could be used to implement qubits is based on use of superconducting materials (superconducting qubits).

In some implementations, namely when superconducting qubits are implemented as transmon qubits, two basic elements of superconducting quantum circuits are inductors and capacitors. However, circuits made using only these two elements cannot make a system with two energy levels because, due to the even spacing between the system's energy levels, such circuits will produce harmonic oscillators with a ladder of equivalent states. A nonlinear element is needed to have an effective two-level quantum state system, or qubit. Josephson Junction is an example of such non-linear, non-dissipative circuit element.

Josephson Junctions may form the central circuit elements of a superconducting quantum computer. A Josephson Junction may include a thin layer of insulator, typically referred to as a barrier or a tunnel barrier, sandwiched between two layers of superconductor. The Josephson Junction acts as a superconducting tunnel junction. Cooper pairs tunnel across the barrier from one superconducting layer to the other. The electrical characteristics of this tunneling are governed by so-called Josephson relations which provide the basic equations governing the dynamics of the Josephson effect:

$$I = I_c \sin\varphi \quad (1)$$

$$V = \frac{\hbar}{2e}\dot{\varphi} \quad (2)$$

In these equations, $\varphi$ is the phase difference in the superconducting wave function across the junction, $I_c$ (the critical current) is the maximum current that can tunnel through the junction, which depends on the barrier thickness and the area of the junction, V is the voltage across the Josephson Junction, I is the current flowing through the Josephson Junction, $\hbar$ is the reduced Planck's constant, and e is electron's charge. Equations (1) and (2) can be combined to give an equation (3):

$$V = \frac{\hbar}{2eI_c\cos\varphi}\dot{I} \quad (3)$$

Equation (3) looks like the equation for an inductor with inductance L:

$$L = \frac{\hbar}{2eI_C\cos\varphi} \quad (4)$$

Since inductance is a function of φ, which itself is a function of I, the inductance of a Josephson Junction is non-linear, which makes an LC circuit formed using a Josephson Junction as the inductor have uneven spacing between its energy states.

The foregoing provides an illustration of using a Josephson Junction in a transmon, which is one type of superconducting qubit. In other classes of superconducting qubits, Josephson Junctions combined with other circuit elements have similar functionality of providing the non-linearity necessary for forming an effective two-level quantum state, or qubit. In other words, when implemented in combination with other circuit elements (e.g. capacitors in transmons or superconducting loops in flux qubits), one or more Josephson Junctions allow realizing a quantum circuit element which has uneven spacing between its energy levels resulting in a unique ground and excited state system for the qubit. This is illustrated in FIG. 1A, providing a schematic illustration of a superconducting quantum circuit 100, according to some embodiments of the present disclosure. As shown in FIG. 1A, an exemplary superconducting quantum circuit 100 includes two or more qubits 102 (reference numerals following after a dash, such as e.g. qubit 102-1 and 102-2 indicate different instances of the same or analogous element). Each of the superconducting qubits 102 may include one or more Josephson Junctions 104 connected to one or more other circuit elements 106, which, in combination with the Josephson Junction(s) 104, form a non-linear circuit providing a unique two-level quantum state for the qubit. The circuit elements 106 could be e.g. capacitors in transmons or superconducting loops in flux qubits. As also shown in FIG. 1A, an exemplary superconducting quantum circuit 100 typically includes means 108 for providing external control of qubits 102 and means 110 for providing internal control of qubits 102. In this context, "external control" refers to controlling the qubits 102 from outside of, e.g., an integrated circuit (IC) chip comprising the qubits, including control by a user of a quantum computer, while "internal control" refers to controlling the qubits 102 within the IC chip. For example, if qubits 102 are transmon qubits, external control may be implemented by means of flux bias lines (also known as "flux lines" and "flux coil lines") and by means of readout and drive lines (also known as "microwave lines" since qubits are typically designed to operate with microwave signals), described in greater detail below. On the other hand, internal control lines for such qubits may be implemented by means of resonators, e.g., coupling and readout resonators, also described in greater detail below.

Any one of the qubits 102, the external control means 108, and the external control means 110 of the quantum circuit 100 may be provided on, over, or at least partially embedded in a substrate (not shown in FIG. 1A). A substrate may include any substrate suitable for realizing quantum circuit components, as described above. In one implementation, the substrate may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of spurious TLS's), and that may serve as a foundation upon which a quantum circuit may be built, falls within the spirit and scope of the present disclosure. Additional examples of substrates include silicon-on-insulator (SOI) substrates, III-V substrates, and quartz substrates.

Figure 1B:
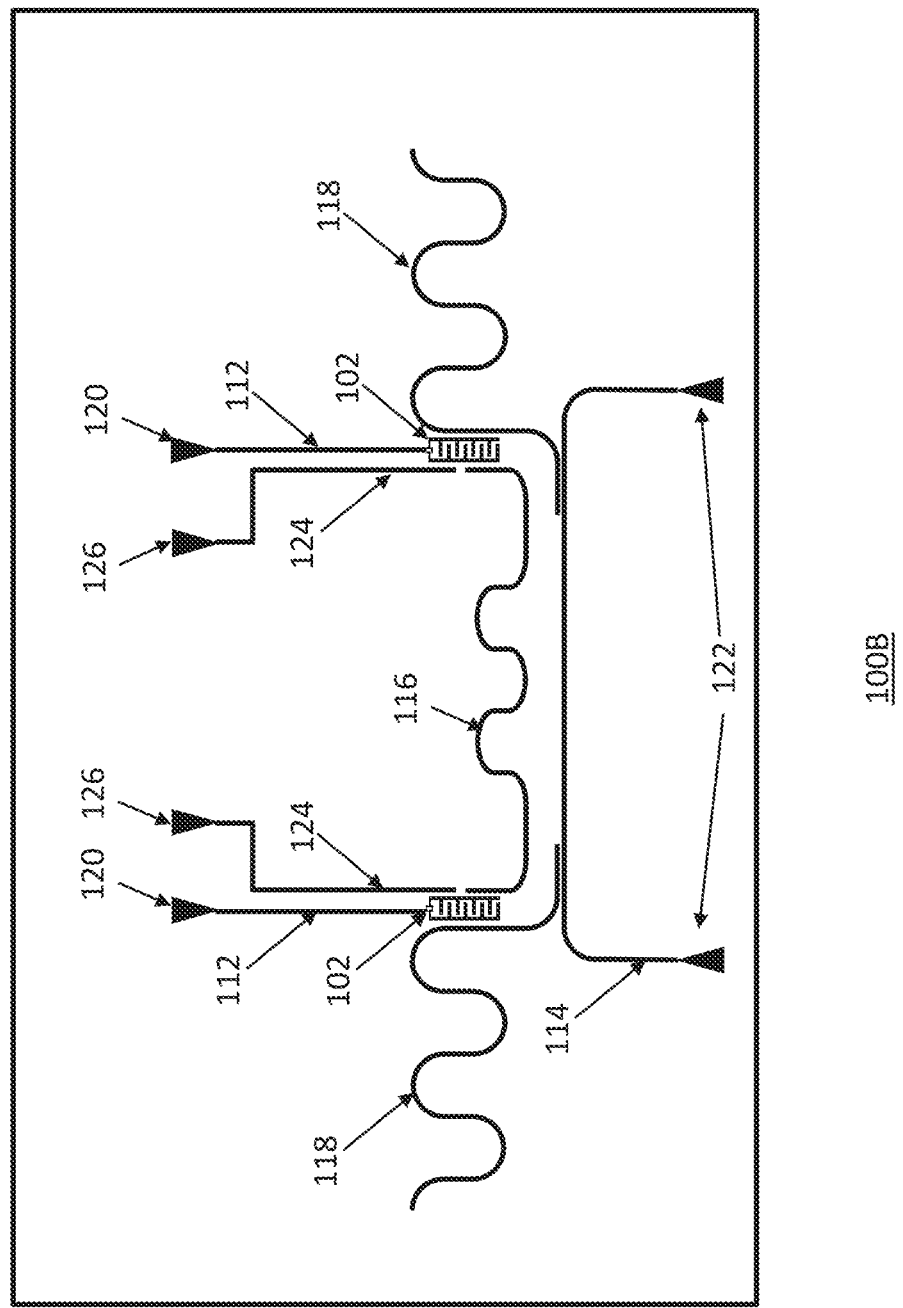
FIG. 1B provides a schematic illustration of an exemplary physical layout of a superconducting quantum circuit, according to some embodiments of the present disclosure.

As previously described herein, within superconducting qubit implementations, three classes are typically distinguished: charge qubits, flux qubits, and phase qubits. Transmons, a type of charge qubits with the name being an abbreviation of "transmission line shunted plasma oscillation qubits", are particularly encouraging because they exhibit reduced sensitivity to charge noise. FIG. 1B provides a schematic illustration of an exemplary physical layout of a superconducting quantum circuit 100B where qubits are implemented as transmons, according to some embodiments of the present disclosure.

Similar to FIG. 1A, FIG. 1B illustrates two qubits 102. In addition, FIG. 1B illustrates flux bias lines 112, microwave lines 114, a coupling resonator 116, a readout resonator 118, and wirebonding pads 120 and 122. The flux bias lines 112 and the microwave lines may be viewed as examples of the external control means 108 shown in FIG. 1A. The coupling resonator 116 and the readout resonator 118 may be viewed as examples of the internal control means 110 shown in FIG. 1A.

Running a current through the flux bias lines 112, provided from the wirebonding pads 120, allows tuning (i.e. changing) the frequency of the corresponding qubits 102 to which each line 112 is connected. In general, it operates in the following manner. As a result of running the current in a particular flux bias line 112, magnetic field is created around the line. If such a magnetic field is in sufficient proximity to the qubit 102, e.g. by a portion of the flux bias line 112 being provided next to the qubit 102, the magnetic field couples to the qubit, thereby changing the spacing between the energy levels of the qubit. This, in turn, changes the frequency of the qubit since the frequency is directly related to the spacing between the energy levels via Planck's equation. The Planck's equation is E=hv, where E is the energy (in this case the energy difference between energy levels of a qubit), h is the Planck's constant and v is the frequency (in this case the frequency of the qubit). As this equation illustrates, if E changes, then v changes. Provided there is sufficient multiplexing, different currents can be sent down each of the flux lines allowing for independent tuning of the various qubits.

The state(s) of each qubit 102 may be read by way of its corresponding readout resonator 118. As explained below, the qubit 102 induces a resonant frequency in the readout resonator 118. This resonant frequency is then passed to the microwave lines 114 and communicated to the pads 122.

To that end, a readout resonator 118 may be provided for each qubit. The readout resonator 118 may be a transmission line that includes a capacitive connection to ground on one side and is either shorted to the ground on the other side (for a quarter wavelength resonator) or has a capacitive connection to ground (for a half wavelength resonator), which results in oscillations within the transmission line (resonance), with the resonant frequency of the oscillations being close to the frequency of the qubit. The readout resonator 118 is coupled to the qubit by being in sufficient proximity to the qubit 102, more specifically in sufficient proximity to the capacitor of the qubit 102, when the qubit is implemented as a transmon, either through capacitive or inductive coupling. Due to a coupling between the readout resonator 118 and the qubit 102, changes in the state of the qubit 102 result in changes of the resonant frequency of the readout resonator 118. In turn, because the readout resonator 118 is in sufficient proximity to the microwave line 114, changes in the resonant frequency of the readout resonator 118 induce changes in the current in the microwave line 114, and that current can be read externally via the wirebonding pads 122.

The coupling resonator 116 allows coupling different qubits together in order to realize quantum logic gates. The coupling resonator 116 is similar to the readout resonator 118 in that it is a transmission line that includes capacitive connections to ground on both sides (i.e. a half wavelength resonator), which also results in oscillations within the coupling resonator 116. Each side of the coupling resonator 116 is coupled (again, either capacitively or inductively) to a respective qubit by being in sufficient proximity to the qubit, namely in sufficient proximity to the capacitor of the qubit, when the qubit is implemented as a transmon. Because each side of the coupling resonator 116 has coupling with a respective different qubit, the two qubits are coupled together through the coupling resonator 116. In this manner, state of one qubit depends on the state of the other qubit, and the other way around. Thus, coupling resonators may be employed in order to use a state of one qubit to control a state of another qubit.

In some implementations, the microwave line 114 may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines such as the line 114 shown in FIG. 1B may be used to only readout the state of the qubits as described above, while separate drive lines such as e.g. drive lines 124 shown in FIG. 1B, may be used to control the state of the qubits. In such implementations, the microwave lines used for readout may be referred to as readout lines (e.g. readout line 114), while microwave lines used for controlling the state of the qubits may be referred to as drive lines (e.g. drive lines 124). The drive lines 124 may control the state of their respective qubits 102 by providing, using e.g. wirebonding pads 126 as shown in FIG. 1B, a microwave pulse at the qubit frequency, which in turn stimulates (i.e. triggers) a transition between the 0 and 1 state of the qubit. By varying the length of this pulse, a partial transition can be stimulated, giving a superposition of the 0 and 1 states of the qubit.

Flux bias lines, microwave lines, coupling resonators, drive lines, and readout resonators, such as e.g. those described above, together form interconnects for supporting propagation of microwave signals. Further, any other connections for providing direct electrical interconnection between different quantum circuit elements and components, such as e.g. connections from electrodes of Josephson Junctions to plates of the capacitors or to superconducting loops of superconducting quantum interference devices (SQUIDS) or connections between two ground lines of a particular transmission line for equalizing electrostatic potential on the two ground lines, are also referred to herein as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog to digital converters, mixers, multiplexers, amplifiers, etc.

In various embodiments, the interconnects as shown in FIG. 1B could have different shapes and layouts. For example, some interconnects may comprise more curves and turns while other interconnects may comprise less curves and turns, and some interconnects may comprise substantially straight lines. In some embodiments, various interconnects may intersect one another, in such a manner that they don't make an electrical connection, which can be done by using e.g. a bridge, bridging one interconnect over the other. As long as these interconnects operate in accordance with use of these interconnects as known in the art for which some exemplary principles were described above, quantum circuits with different shapes and layouts of the interconnects than those illustrated in FIG. 1B are all within the scope of the present disclosure.

Coupling resonators and readout resonators may be configured for capacitive coupling to other circuit elements at one or both ends in order to have resonant oscillations, whereas flux bias lines and microwave lines may be similar to conventional microwave transmission lines because there is no resonance in these lines. Each one of these interconnects may be implemented as a coplanar waveguide, which is one type of transmission line. A stripline is another type of transmission line. Typical materials to make the interconnects include aluminum (Al), niobium (Nb), niobium nitride (NbN), titanium nitride (TiN), and niobium titanium nitride (NbTiN), all of which are particular types of superconductors. However, in various embodiments, other suitable superconductors may be used as well.

As previously described herein, FIG. 1B illustrates an embodiment specific to transmons. Subject matter is not limited in this regard and may include other embodiments of quantum circuits implementing other types of superconducting qubits that would also utilize Josephson Junctions as described herein, all of which are within the scope of the present disclosure.

Figure 1C:
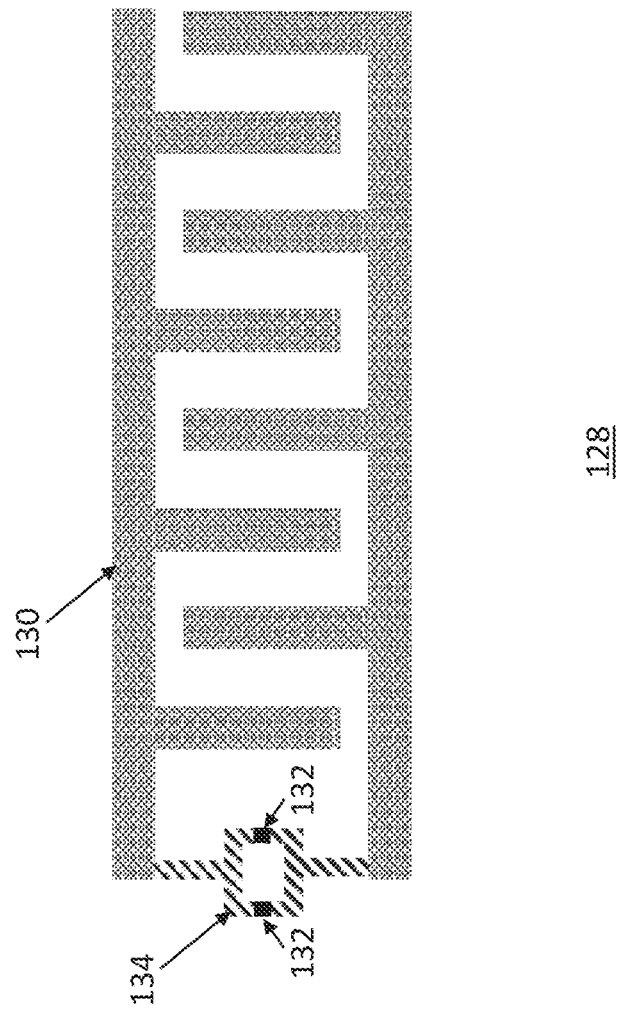
FIG. 1C provides a schematic illustration of an exemplary transmon, according to some embodiments of the present disclosure.

FIG. 1C illustrates an exemplary transmon 128 which could be used as any one of the qubits 102, according to some embodiments of the present disclosure. Presence of a capacitor 130 of such a size that capacitive energy is significantly larger than the Josephson energy in a qubit of FIG. 1C indicates that the qubit is a transmon. The capacitor 130 is configured to store energy in an electrical field as charges between the plates of the capacitor.

The capacitor 130 is depicted as an interdigitated capacitor, a particular shape of capacitor that provides a large capacitance with a small area, however, in various embodiments, other shapes and types of capacitors may be used as well. For example, such a capacitor could be implemented simply as two parallel plates with vacuum in between. Furthermore, in various embodiments, the capacitor 130 may be arranged in any direction with respect to the SQUID or a single Josephson Junction, not necessarily as shown in FIG. 1C.

In addition, the transmon illustrated in FIG. 1C includes two Josephson Junctions 132 incorporated into a superconducting loop 134. The two Josephson Junctions 132 and the superconducting loop 134 together form a superconducting quantum interference device (SQUID). Magnetic fields generated by the flux bias line 112 connected to the qubit extend to the SQUID (i.e. current in the flux bias line 112 create magnetic fields around the SQUID), which in turn tunes the frequency of the qubit.

In other embodiments, a SQUID could include only one Josephson Junction, or a transmon could be implemented with a single Josephson Junction without the superconducting loop. A single Josephson Junction without the SQUID is insensitive to magnetic fields, and thus, in such an implementation, flux bias lines 112 may not be used to control the frequency of the transmon.

While FIGS. 1A and 1B illustrate examples of quantum circuits comprising only two qubits 102, embodiments with any larger number of qubits are possible and are within the scope of the present disclosure.

Furthermore, while the present disclosure includes references to microwave signals, this is done only because current qubits are designed to work with such signals because the energy in the microwave range is higher than thermal excitations at the temperature that qubits are operated at. In addition, techniques for the control and measurement of microwaves are well known. For these reasons, typical frequencies of superconducting qubits are in 5-10 gigahertz (GHz) range, in order to be higher than thermal excitations, but low enough for ease of microwave engineering. However, advantageously, because excitation energy of superconducting qubits is controlled by the circuit elements, these qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

In various embodiments, quantum circuits such as the one shown in FIGS. 1A-1B may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the integrated circuit. The integrated circuit may be employed as part of a chipset for executing one or more related functions in a quantum system.

At least some of the quantum circuit elements shown in or discussed with reference to FIGS. 1A-1C may include interconnects below the qubit plane as described herein.

Figure 2:
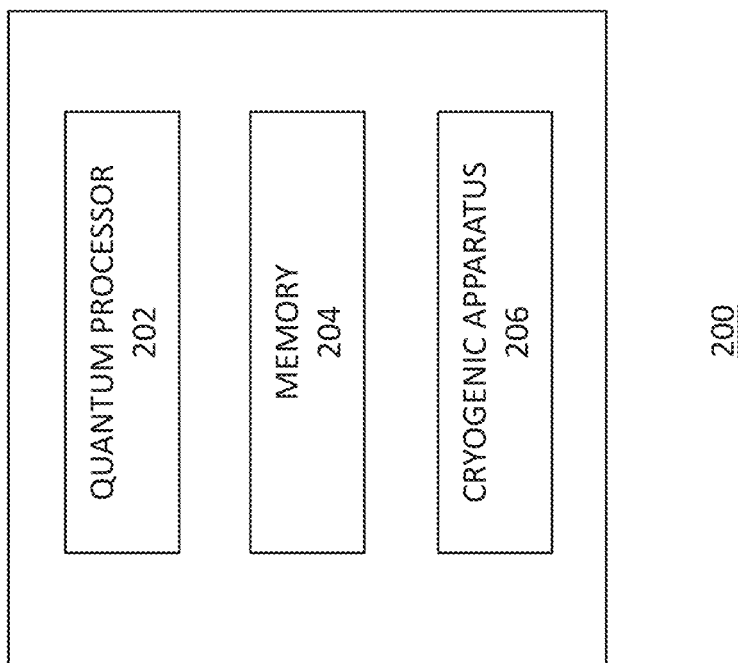
FIG. 2 provides a schematic illustration of quantum computing device, according to some embodiments of the present disclosure.

FIG. 2 provides an illustration of quantum computing device, e.g. a quantum computer, 200, according to some embodiments of the present disclosure. The computing device 200 may be any electronic device that processes quantum information. In some embodiments, the computing device 200 may include a number of components, including, but not limited to, a quantum processor 202, a memory 204, and a cryogenic apparatus 206, as shown in FIG. 2. Each of the quantum processor 202 and the memory 204 may include one or more quantum circuits, or individual elements thereof, comprising interconnects below the qubit plane as described herein, e.g. quantum circuits elements as illustrated in FIGS. 1A-1C.

The processor 202 may be a universal quantum processor or a specialized quantum processor configured to run quantum simulations, or one or more of particular quantum algorithms. The term "processor" may refer to any device or portion of a device that processes electronic data from registers and/or memory to transform that electronic data into other electronic data that may be stored in registers and/or memory. In some embodiments, the processor 202 may be configured to execute algorithms that may be particularly suitable for quantum computers, such as e.g. cryptographic algorithms that utilize prime factorization, algorithms to optimize chemical reactions, or protein folding algorithms. The term "processor" may refer to any device or portion of a device that processes quantum information.

In various embodiments, the computing device 200 may include other components not shown in FIG. 2, such as e.g. one or more of a controller, I/O channels/devices, supplementary microwave control electronics, multiplexer, signal mixers, a user interface, as well as other quantum devices such as e.g. quantum amplifiers, quantum sensors, which quantum devices may also implement certain embodiments of the present dislcosure.

In various embodiments, the computing device 200 may be included within a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other quantum electronic device that processes data by utilizing quantum mechanical phenomena.

In order to highlight the advantages offered by interconnects below the qubit plane as described herein, it would be helpful to first explain how conventional interconnects in superconducting quantum circuits are typically implemented.

Figure 3:
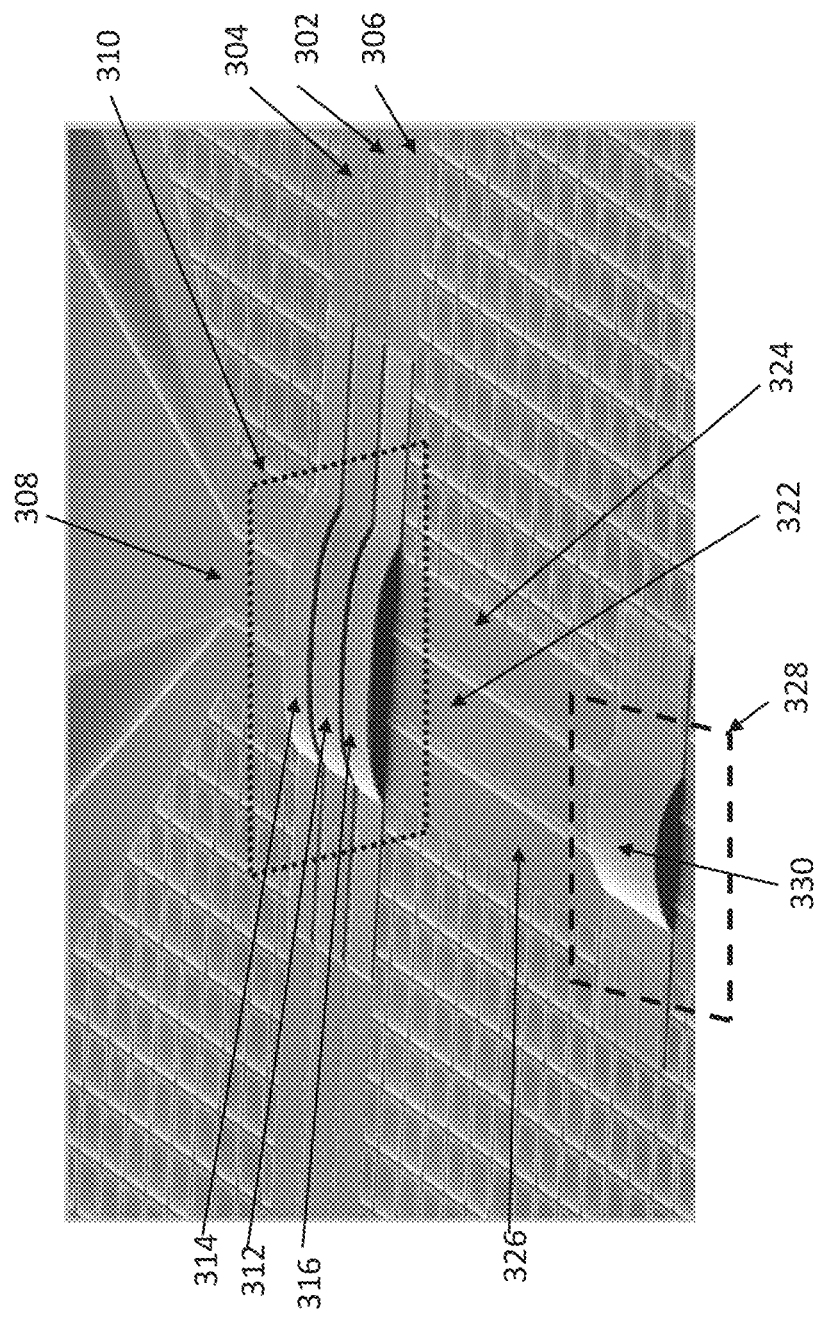
FIG. 3 illustrates conventional air bridges providing electrical interconnections above the qubit plane of a quantum circuit.

There may be instances when two portions of interconnects provided in different areas of a superconducting quantum circuit may be electrically connected together. In one example, this may happen when two different interconnects need to intersect one another in such a manner that electrical connection is not made between them. FIG. 3 illustrates such a scenario where a signal line 302 and two ground planes 304 and 306 of one interconnect needs to cross another interconnect 308. As shown with a dotted box 310 in FIG. 3, such intersection may be realized by using an air-bridge where two portions of each of the interconnects 302, 304, and 306 on the different sides of the interconnect 308 are electrically interconnected by means of a respective air bridge 312, 314, and 316.

In another example, two grounding lines of a single interconnect may need to be electrically connected together to ensure that the two ground planes on either side of the signal line are at the same electrostatic potential. Such a scenario is also illustrated in FIG. 3 where an interconnect comprising a signal line 322 and two ground planes 324 and 326 is shown. As shown with a dashed box 328 in FIG. 3, the two ground planes 324 and 326 are interconnected using an air-bridge 330. Such air-bridges, FIG. 3 illustrating one of which, are sometimes referred to as "grounding straps" to highlight the fact that they connect different ground planes. Air bridges used as grounding straps help eliminate spurious microwave modes that may be present in the ground plane, thus reducing potential for loss of quantum information from the quantum circuit interconnects.

Providing electrical connectivity between different portions of interconnects using air bridges such as e.g. air bridges 312, 314, 316, and 330 shown in FIG. 3 involves free-floating straps of metal prone to a number of potential issues such as e.g. breakage under mechanical shock, strain and/or breakage under thermal cycling, mechanical oscillations and/or vibrations, etc. If present, each of these issues could be very problematic because they would result in variations in quantum circuit properties.

Embodiments of the present disclosure improve on at least some of these issues by, instead of going over the qubit plane as is done using air bridges, providing interconnects below the surface of the qubit plane.

Figure 4:
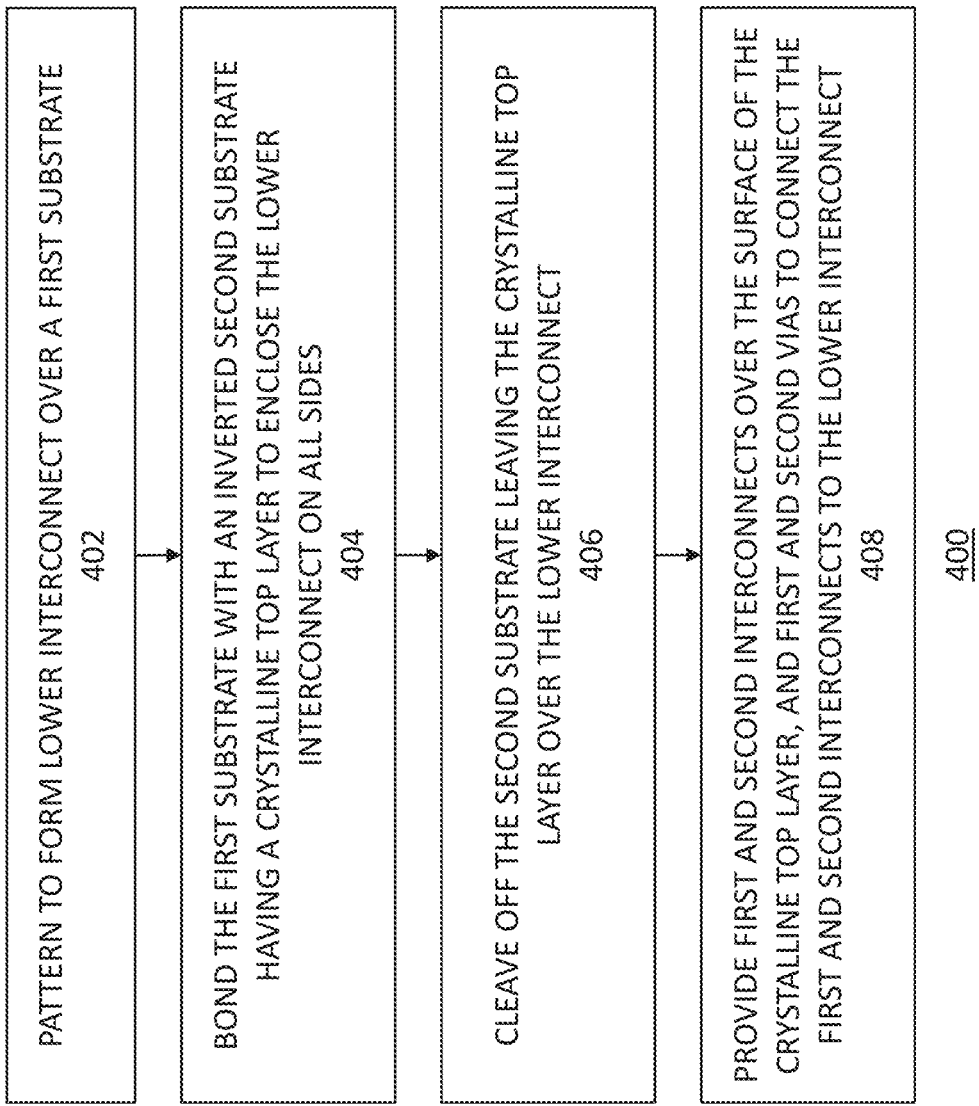
FIG. 4 provides a flow chart of a method for fabricating structures comprising one or more interconnects below the qubit plane of a quantum circuit, according to some embodiments of the present disclosure.

FIG. 4 provides a flow chart of a method 400 for fabricating structures comprising one or more interconnects below the qubit plane of a quantum circuit, according to some embodiments of the present disclosure. Description of the method 400 is followed by description of FIGS. 5A-5D, FIGS. 6A-6D, FIGS. 7A-7D, and FIGS. 8A-8D providing a schematic illustration of some details of different fabrication steps of the method 400, according to some embodiments of the present disclosure.

The method may begin with performing conventional patterning to form, over an interconnect support layer, a desired interconnect that will later function as a lower interconnect (box 402). The patterning is conventional in a sense that it forms an interconnect on top of an interconnect support layer, as known in the art for materials with superconducting behavior at qubit operating temperatures. At this point this interconnect is not yet below the surface on which qubits will be provided. The interconnect support layer may be a substrate (in this context, a first substrate) or may be provided on top of a substrate and may include any material suitable for realizing quantum circuit components as those described herein, e.g. components as described with reference to FIGS. 1A-1C and FIG. 2. In some implementations, the interconnect support layer may comprise a crystalline material such as, but not limited to silicon or sapphire. In other implementations, the interconnect support layer may be non-crystalline. In general, any material that provides sufficient advantages (e.g. sufficiently good electrical isolation and/or ability to apply known fabrication and processing techniques) to outweigh the possible disadvantages (e.g. negative effects of spurious TLS's), and that may serve as a foundation upon which a quantum circuit may be built, falls within the spirit and scope of the present disclosure for use as the interconnect support layer.

The conventional patterning of box 402 may use the typical materials such as e.g. superconductors, barriers, liners, dielectrics, hard masks, and so on, to form a patterned lower interconnect over a first substrate. The lower interconnect may be covered with a thin layer of materials that would promote bonding of the first substrate with a second substrate, e.g. a thin layer of silicon oxide. Such a layer used for bonding could be e.g. between 10 and 500 nm, including all values and ranges therein, e.g. between 10 and 100 nm or around 100 nm.

The method then proceeds with bonding the first substrate having the lower interconnect provided thereon with a second substrate (box 404). In some embodiments, the second substrate could be a Silicon-on-Insulator (SOI) wafer, i.e. a wafer having a thin layer of crystalline silicon on top of an insulator provided over the rest of the silicon substrate. The SOI wafer will typically also have an oxide on top to bond with the silicon oxide on the lower wafer containing the lower interconnect. The wafer may be treated with plasma sputter ash to remove surface contaminants prior to bonding. The SOI wafer is inverted, pushed together with the lower interconnect wafer, and thermally treated for chemical bonding via the two silicon oxide layers. Such thermal treatment may include e.g. a relatively low temperature bonding, e.g. applying temperature in the range of 100 to 500 degrees Celsius. As a result, the interconnect formed on the first substrate in box 402 is now enclosed by crystalline material both on its top and bottom sides. In case the interconnect of box 402 was formed by recessing the surface of a crystalline first substrate, such interconnect would be enclosed by crystalline material also on its sides—i.e. enclosed by crystalline material on all sides.

In other embodiments, the second substrate could be a wafer that has a crystalline $Al_2O_3$ (sapphire) grown on it epitaxially. The sapphire could be an alternative to the crystalline silicon on top of an insulator in a SOI wafer, i.e. it would serve as a crystalline material enclosing the interconnect in the first substrate.

Following bonding of the first and second substrates, most of the second substrate is cleaved off, leaving the crystalline top layer over the lower interconnect (box 406). Doing so effectively moves the upper surface of the first substrate higher, so that now the lower interconnect is embedded below the new surface of the first substrate.

Next, first and second interconnects are provided on the surface of the crystalline top layer that formed the new surface of the first substrate in box 406, and first and second vias are formed connecting the lower interconnect to, respectively, the first and second interconnects (step 408). At this time, one or more superconducting qubits may also be formed on the surface of the crystalline top layer that formed the new surface of the first substrate in box 406. Since the first and second interconnects are provided in the same plane with such superconducting qubits, these interconnects are in-plane interconnects. On the other hand, since the lower interconnect is provided in a plane that is below that of the superconducting qubits, this interconnect is a below-plane interconnect.

In some embodiments, the distance between the lower interconnect and the new surface of the first substrate may be between 50 nanometers (nm) and 50 micrometers (micron), e.g. between 50 nm and 10 microns, between 50 nm and 5 micron, or in any other values and ranges. Providing a lower interconnect at such distance from the qubit plane allows realizing electrical connectivity with relatively short path length while avoiding having to use air bridges or through-substrate interconnects. The less is the depth at which the lower interconnect is provided in the first substrate, the shorter is the length of the total interconnect element providing electrical connectivity between the first and second in-plane interconnects (i.e. the total interconnect element is the lower interconnect, plus the first and second vias).

As described above, one major source of loss, and thus decoherence in superconducting qubits are spurious TLS's in quantum circuits. In particular, in context of superconducting qubits, the dominant source of decoherence is thought to be TLS's in non-crystalline dielectric materials surrounding interconnects and Josephson Junctions. These TLS's are thought to be either an electron on an ion that can tunnel between two spatial states, which are caused either by defects in the crystal structure of the substrate or through polar impurities such as hydroxyl (OH—) groups.

One mechanism of how spurious TLS's can lead to decoherence of superconducting qubits in a quantum circuit is based on the idea that, if the TLS's are in a close proximity to the interconnect, they can couple to it. When this happens, spurious TLS's and the interconnects exchange energy in the form of energy leaked from the interconnects and absorbed by the spurious TLS's.

When interconnects are embedded in interconnect support layers, as is the case with the below-plane interconnects described herein, more TLS-prone dielectric material of the interconnect support layer surrounds the interconnects, compared to interconnects provided in- or above-plane. For in-plane interconnects, at least the upper surface of the interconnects is not in contact with a TLS-prone material of the interconnect support layer. For above-plane (e.g. air bridges) interconnects, even more surfaces of an interconnect are not in contact with a dielectric interconnect support layer. Therefore, if embedded interconnects are to be implemented, care should be taken to reduce the amount of TLS's in the areas surrounding the below-plane interconnects. Providing the below-plane interconnects by bonding of two substrates allows enclosing a conventionally formed interconnect by other materials, i.e. providing a below-plane interconnect. By selecting the dielectric materials of the two substrates to be materials that can be relatively low-loss in terms of losses to spurious TLS's or other resistive elements described above, as e.g. crystalline dielectric materials are thought to be, losses to spurious TLS's in the areas surrounding the below-plane interconnects may be minimized. Looking at it from a slightly different perspective, the interconnects may not be perfect in that they may have some spurious TLS's, but by keeping at least some of them away from the qubit plane (by implementing them as below-plane interconnects), and by surrounding the qubit plane with crystalline material in its near vicinity, any TLS's induced by the conventional patterning of the lower interconnects would be sufficiently far away from the qubit plane to act as a loss. In other words, providing at least some interconnects below the qubit plane allows tolerating that those interconnects could have some defects because those defects do not matter if the interconnects are sufficiently far enough away from the qubit plane.

A person of ordinary skill in the art would recognize that steps of the method shown in FIG. 4 may be realized in different manners. Some of those are shown in FIGS. 5A-5D, FIGS. 6A-6D, FIGS. 7A-7D, and FIGS. 8A-8D. Each of these figures illustrates a cross-sectional view of a structure comprising a lower interconnect embedded in a first substrate, with the cross-section taken along a plane perpendicular to the plane of the substrates. A legend provided within a dashed box at the bottom of each page containing these figures illustrates patterns used to indicate different elements shown in FIGS. 5A-5D, FIGS. 6A-6D, FIGS. 7A-7D, and FIGS. 8A-8D, so that these figures are not cluttered by many reference numerals. Moreover, similar reference numerals in FIGS. 5A-5D, FIGS. 6A-6D, FIGS. 7A-7D, and FIGS. 8A-8D are used to illustrate analogous elements in the figures. For example, reference numerals 502, 602, 702, and 802 shown, respectively, in FIGS. 5, 6, 7, and 8 refer to a first substrate (or an interconnect support layer provider over a first substrate). In other examples, reference numerals 506, 606, 706, and 806 refer to patterned interconnect forming a below-plane lower interconnect, reference numerals 616, 716, and 816—to first and second vias, and reference numerals 618, 718, and 818—to in-plane interconnects. When provided with reference to one of the figures, discussions of these elements are applicable to other figures, unless stated otherwise. Thus, in the interests of brevity, discussions of similar elements are not repeated for each of the figures but, rather, the differences between the figures are described.

FIGS. 5A-5D, FIGS. 6A-6D, FIGS. 7A-7D, and FIGS. 8A-8D are now described with reference to the interconnect support layer being a silicon substrate. However, a person of ordinary skill in the art would recognize how to adapt these discussions to other types of interconnect support layers and/or substrates, all of which are within the scope of the present disclosure.

FIGS. 5A-5D illustrate implementation of boxes 402-406 of the method shown in FIG. 4, according to some embodiments of the present disclosure. A fabrication process of box 402 of FIG. 4 may begin with a substrate 502, e.g. a silicon (Si) substrate.

In some embodiments, the substrate 502 may comprise at least a layer of non-doped or low-doped silicon. In this context, non-doped or low-doped silicon implies a non-conductive silicon at temperatures at which qubits operate (i.e. very low temperatures). A person of ordinary skill in the art would recognize that intrinsic layers may sometimes be accidentally doped with defects due to e.g. the addition of unintentional impurities (e.g., 0, residual dopants in the chamber, etc) or unintentional doping from the highly conductive region by diffusion during subsequent thermal processing. Furthermore, sometimes dopants may be deliberately added to materials for reasons such as e.g. thermal or mechanical stability. As long as dopants, whether unintentional or deliberately added, are in amounts that are low enough so that the substrate may still be considered low-loss and insulating at low temperatures at which qubits operate, such silicon may be referred to as intrinsic or non-doped silicon.

Figure 5B:
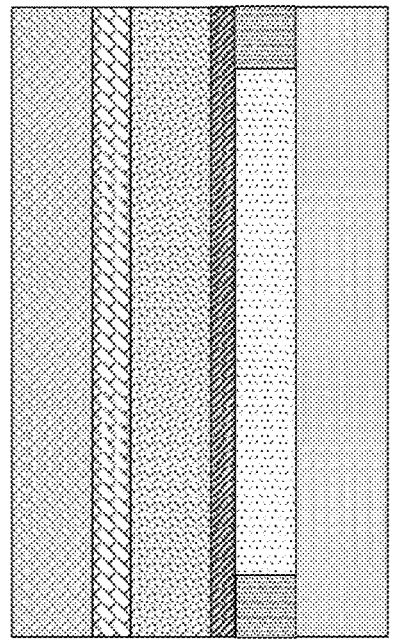
FIGS. 5A-5D illustrate implementation of boxes 402-406 of the method shown in FIG. 4, according to some embodiments of the present disclosure.
Figure 5D:
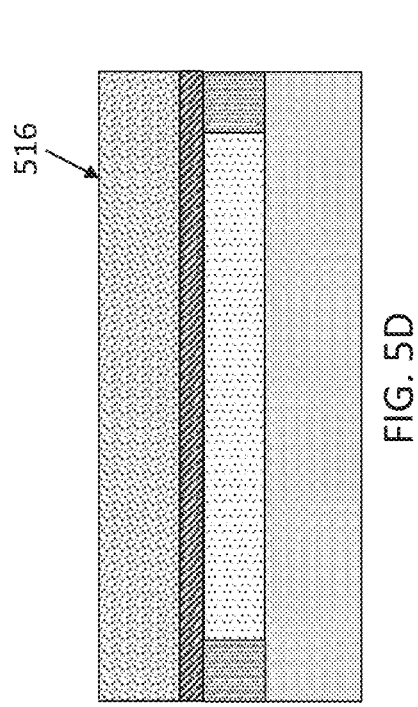
Figure 5A:
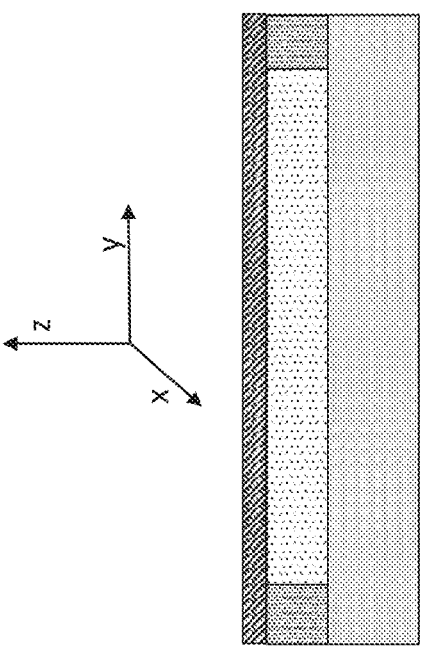

FIG. 5A illustrates that a superconducting lower interconnect 506 is patterned on top of the substrate 502, and is covered with a thin layer 508 of silicon oxide. Dimensions of the lower interconnect 506 in the x- and y-directions (x, y, and z-axes shown at the top of FIG. 5A) could be, respectively, between 50 nm (nanometers) and 100 um (microns) for both the x-axis and y-axis, including all values and ranges therein.

In some embodiments, the lower interconnect 506 may be formed by adding it on top of the first substrate 502, in which case another dielectric may be provided as a material on the sides 504 of the lower interconnect 506. Any material suitable for use as an interlayer dielectic (ILD) may be used for this purpose. Alternatively, the lower interconnect 506 may be formed by recessing the top of the first substrate 502 to form an opening into which superconducting material of the lower interconnect 506 is then deposited. This implementation may be advantageous because it eliminates the need for including another dielectric material around the lower interconnect, which dielectric material could be more lossy than the substrate 502, i.e. areas 504 shown in FIG. 5A could then be made from the same material as the substrate 502. Areas 504 and 502 in the figures are shown with different patterns only to preserve the generality that these areas could be made of different materials.

In various embodiments, any kind of conventional patterning techniques may be used to form the lower interconnect 506 on the first substrate 502. For example, first a photoresist mask defining the dimensions and location of the future lower interconnect 506 may be formed. To that end, any kind of photoresist patterning techniques as known in the art may be used. For example, in an embodiment, patterning includes depositing a layer of photoresist for later forming a patterned photoresist layer over the substrate 502. The photoresist may be a positive or negative resist and may include for example, poly(methyl methacrylate), poly(methyl glutarimide), DNQ/novolac, or SU-8 (an expoxy based negative resist). The photoresist may be deposited by a casting process such as, for example, spin-coating. Spin coating may be performed at 1 to 10,000 rpm, including all values and ranges therein, for a time period in the range of 1 second to 10 seconds, including all values and ranges therein.

The photoresist may then be patterned by optically projecting an image of a desired pattern onto the photoresist using photolithography, such as optical photolithography, immersion photolithography, deep UV lithography, extreme UV lithography, or other techniques, wherein the wavelength of projected light may be up to 436 nm, including all values and ranges from 157 nm to 436 nm, such as 157 nm, 193 nm, 248 nm, etc. A developer, such as tetramethylammonium hydroxide TMAH (with or without surfactant) at a concentration of in the range of 0.1 N to 0.3 N, may be applied to the photoresist, such as by spin-coating, and portions of the photoresist are removed to expose regions of the underlying substrate 502 correlating to the desired pattern.

In some embodiments, baking of the substrate 502 may occur before or after any of the above actions. For example, the substrate 502 may be prebaked to remove surface water. In some embodiments, prebaking may be performed at a temperature in the range of 200° C. to 400° C., including all values and ranges therein, for a time of 10 seconds to 60 minutes, including all values and ranges therein. After application of the photoresist, a post application bake may occur, wherein at least a portion of the solvents in the photoresist are driven off. A post application bake is, for example, performed at temperatures in the range of 70° C. to 140° C., including all values and ranges therein, for a time period in the range of 10 seconds to 240 seconds, including all values and ranges therein. After patterning, the resist may be hard baked at a temperature in the range of 100° C. to 300° C., including all values and ranges therein, for a time period of 10 seconds to 10 minutes, including all values and ranges therein.

Next, selective metal recess may be carried out in order to recess the substrate 502 so that the lower interconnect 506 would be surrounded by the material of the substrate 502 on all of its sides except for the top surface. This may be carried out e.g. by wet etching the substrate 502 in the photoresist opening using a single solution of mineral or an organic acid and a peroxide, or may be performed using two solutions in a two-step process, or may be performed by using a plasma-based dry etch.

After that, the photoresist mask may be cleaned off, e.g. via a process such as ashing, where the photoresist is exposed to oxygen or fluorine, which combines with the photoresist to form ash which can subsequently be removed.

The substrate 502 with a portion 506 for forming the lower interconnect may then be covered with a thin layer 508 of silicon oxide used for bonding. This may be done e.g. by chemical vapor deposition, plasma-enhanced chemical vapor deposition, and/or spin coating as typically done in conventional processing.

Next, in box 404 of FIG. 4 described above, the first substrate 502 having the portion 506 embedded therein is bonded with an inverted second substrate. This is illustrates in FIG. 5B showing the second substrate as a SOI wafer comprising a silicon substrate 514, a thin silicon oxide layer 502 for attaching a thin SOI layer 510 to the silicon substrate 514, and the SOI layer 510. In various embodiments, the thickness of the SOI layer 510 is between 10 and 150 nm, including all values and ranges therein, e.g. around 100 nm. The second substrate is inverted, as is shown in FIG. 5B with the first and second substrates 502 and 514 being, respectively, the bottom and the top layers of the stack. The SOI wafer may, and typically would include, another thin layer of silicon oxide used for substrate bonding, similar to the layer 508 provided over the first substrate as shown in FIG. 5A. However, for reasons of clarity, FIG. 5B and subsequent figures illustrate only a single silicon oxide layer 508 because that would be the case after bonding.

It should also be noted that, since the SOI wafer is not patterned when it is bonded to the first substrate, there is no specific critical registration or alignment that may be needed between the two wafers, simplifying the fabrication/bonding process.

Figure 5C:
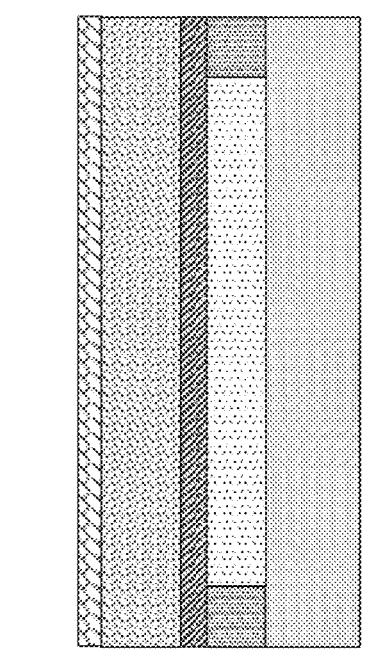

The SOI substrate is then cleaved off, as described with reference to box 406 of FIG. 4 and as shown in FIG. 5C, resulting in a thin crystalline layer 510 being transferred on top of the lower interconnect portion 506.

Next, the oxide 512 is removed from the surface of the SOI layer 510, as shown in FIG. 5D, and the surface may further be cleaned using an appropriate cleaning technique. Removing the oxide and cleaning the surface 516 of the SOI layer 510 may be done prior to deposition of the superconducting layer forming the in-plane interconnects (as shown in subsequent figures) in order to improve quality of Si/superconductor interface in terms of removal of any lossy native oxide layers. This may further be followed by any deposition or treatment to change the chemical nature of the resulting Si surface. Such processing may include removal of the oxide 512 by using one or a combination of wet chemical fluorine etching solutions including but not limited to aqueous HF or aqueous $NH_4F$ or combinations thereof. Such processing may also include dry etching, for example using a plasma dry etch tool along with $SF_6$, $CF_4$, or $NF_3$, or any combination thereof to remove native oxide followed by further in-situ or ex-situ processing which may include, but is not limited to, high temperature thermal treatments for times up to a few hours at temperatures up to 1400 C, exposure of the surface to hot gaseous vapor or plasmas containing chemicals such as $N_2$, $NH_3$, organic molecules, organosilicon molecules, metal precursors, etc, designed to create a chemically distinct transition region between the Si substrate and the superconducting film to be deposited in later steps.

As shown in FIG. 5D, bonding of the first and second substrates and removing everything of the second substrate except the SOI layer 510 results in the lower interconnect portion 506 being embedded (enclosed on all sides) within the structure, i.e. being below the surface of the structure but above the very bottom of the substrate. In particular, the lower interconnect 506 is enclosed on the bottom by the crystalline first substrate 502 and on top by the crystalline SOI layer 510, both of which are expected to have reduced amounts of spurious TLS's detrimental to qubits' operation. The top surface 516 of the crystalline SOI layer 510 may now be considered to be the top surface of the first substrate 502.

At this point, there are some choices involving the order of the next steps: via formation, deposition of superconductor, and circuit patterning to form in-plane interconnects. FIGS. 6, 7, and 8 illustrate embodiments in which the order of these steps is different.

FIGS. 6A-6D illustrate implementation of box 408 of the method shown in FIG. 4, according to a first embodiment of the present disclosure. FIG. 6A illustrates the same structure as that shown in FIG. 5D because such a structure provides the starting point for forming vias and in-plane interconnects. Thus, FIG. 6A illustrates a lower interconnect 606 embedded under the new top surface 616 of a first substrate 602, the new top surface 616 being the upper surface of the remaining SOI layer 610 of the second substrate which was bonded to the first substrate in box 404. Next, as shown in FIG. 6B, vias 618 are provided, extending from the upper surface 616 to the lower interconnect 606, as shown in FIG. 6B.

In some embodiments, the vias 618 may be provided using one or more dopant implantation techniques followed up by the anneal to activate the dopants. After the anneal, such an approach is expected to preserve the Si lattice of the SOI layer 610 and lead to the growth/deposition of superconductor materials for the in-plane interconnects on top of the substrate without disturbing the film growth near the via regions.

In other embodiments, the vias 618 may be provided using conventional techniques for forming vias by photoresist patterning, followed by Si etch to form via openings through the SOI layer 610 and the oxide layer 608 to the lower interconnect 610, deposition of Ohmic contacts, and anneal. In such embodiments, photoresist patterning similar to that described above may be used to define locations for forming via openings for the vias 618 in the SOI layer 610 by forming openings in the photoresist mask provided over the SOI layer 610. Exposed portions of the SOI layer 610 may then be chemically etched, where the exposed portions of the surface are removed until a desired depth is achieved, forming openings in the SOI layer 610 and the oxide layer 608. The SOI layer 610 at least partially surrounds the via openings, isolating them from other openings that may be formed both physically and electrically. Once via openings are formed, the openings may be filled in with a suitable superconducting material, such as e.g. Nb, NbN, TiN, NbTiN, Al, etc.

In some embodiments, deposition of the suitable superconducting material into via openings may be performed using a conformal coating process, wherein the suitable superconducting material is deposited on any exposed surface of the first substrate, including on the sidewalls and bottom of any opening formed in the first substrate. A conformal coating may, therefore, be understood as a coating that is applied to exposed surfaces of the first substrate, and not, for example, just to horizontal surfaces. The conformal coating process may be selected from processes such as chemical vapor deposition or atomic layer deposition.

In chemical vapor deposition, for example, one or more reactive gases are provided in a chamber including the first substrate at a flow rate of 5 sccm to 500 sccm, including all values and ranges therein. In some examples, the reactive gas may be selected from one or more of the following: pentakis(dimethylamino)tantalum, tris(diethylamido)(tert-butylimido)tantalum(V), tris(ethylmethylamido)(tert-butylimido)tantalum(V), or titanium tetrachloride and ammonia provided at a 1:1 stoichiometric ratio. The reactive gas may be provided with a carrier gas, such as an inert gas, which may include, for example, argon.

In some embodiments, the chamber may be maintained at a pressure in the range of 1 mTorr to 100 mTorr, including all values and ranges therein, and a temperature in the range of 100° C. to 500° C., including all values and ranges therein. In some embodiments, the process may be plasma assisted where electrodes are provided within the process chamber and are used to ionize the gases. Alternatively, plasma may be formed outside of the chamber and then supplied into the chamber. In the chamber, a layer of the metal is deposited on the surface of the first substrate due to reaction of the gas.

Other processes that may be used to deposit suitable superconducting materials into the via openings include physical vapor deposition such as, magnetron sputtering, evaporative deposition or e-beam deposition.

In physical vapor deposition, a workpiece (i.e. the first substrate with the lower interconnect embedded therein and via openings provided) is placed in a process chamber. A reactive gas, such nitrogen, is supplied to the process chamber at a flow rate in the range of 10 sccm to 100 sccm, including all values and ranges therein such as 40 sccm to 50 sccm or 45 sccm. An inert gas, such as argon, may optionally be supplied into the process chamber as well. Prior to supplying the reactive gas, the base pressure of the process chamber may be in the range of $10^{-8}$ torr and held at a pressure in the range of $10^{-7}$ to $10^{-1}$ torr during sputtering, such as in the range of 1 millitorr to 10 millitorr, or 2.5 millitorr. The process chamber may be maintained at a temperature in the range of 10° C. to 100° C., including all values and ranges therein, such as in the range of 10° C. to 20° C. or 17° C.

A metal target may be positioned in the process chamber and formed of a superconducting metal. The metal target may be biased by a DC sources rated in the range of −50 V to −1000 V, including all values and ranges therein. The workpiece, or worktable, may also be biased by an AC source rated in the range of −50 V to −100 V including all values and ranges therein, such as −70 to −80 V.

During deposition, a plasma forms and is localized around the target due to magnets positioned proximal to or behind the target. The plasma bombards the target sputtering away the metal atoms as a vapor, which is then deposited on the workpiece. The process may continue for a time period in the range of 1 second to 100 seconds.

Once the vias 618 of superconducting materials are formed, a layer of a superconducting material may be deposited over the substrate with the vias 618, as shown in FIG. 6C with a superconducting layer 620, moving the top surface of the structure even higher, to a surface 622 of the superconducting layer 620. Again, any superconducting material may be used for the layer 620, such as e.g. Nb, NbN, TiN, NbTiN, Al, etc, and the layer 620 may be deposited any of the metal deposition techniques described above.

Once the superconducting layer 620 is formed, the layer may be patterned to create the first and second interconnects in the qubit plane. FIG. 6D illustrates the superconducting layer 620 patterned to form three superconducting features: 624, 626, and 628. Interconnects 624 and 628 are provided over the vias 618, thus these are the first and second in-plane interconnects for which the lower interconnect 606 provides electrical connectivity. In some embodiments, the interconnects 624 and 628 could e.g. be the different ground lines or planes of a single microwave interconnect (i.e. as was done before using the ground straps shown in FIG. 3B) in a quantum circuit as described above. In other embodiments, the interconnects 624 and 628 could e.g. be different portions of a single interconnect line or plane intersecting another interconnect (i.e. as was done before using the air bridges shown in FIG. 3A).

To pattern the superconducting layer 620, any conventional techniques including e.g. photoresist patterning, followed by etch of the superconductor to electrically isolate different interconnect features, may be used.

FIGS. 7A-7D illustrate implementation of box 408 of the method shown in FIG. 4, according to a second embodiment of the present disclosure. Similar to FIG. 6A, FIG. 7A illustrates the same structure as that shown in FIG. 5D because such a structure provides the starting point for forming vias and in-plane interconnects. Thus, FIG. 7A illustrates a lower interconnect 706 embedded under the new top surface 716 of a first substrate 702, the new top surface 716 being the upper surface of the remaining SOI layer 710 of the second substrate which was bonded to the first substrate in box 404. Next, as shown in FIG. 6B, a superconducting layer 720 is deposited, as shown in FIG. 7B, similar to the deposition of the layer 620 described above. After that, vias 718 are provided, extending from the upper surface 722 of the superconducting layer 720, through the SOI layer 710 and the oxide layer 708, to the lower interconnect 706, as shown in FIG. 7C.

Similar to the first embodiment shown in FIGS. 6A-6D, in some embodiments of the second embodiment shown in FIGS. 7A-7D, the vias 718 may be provided using conventional techniques for forming vias, such as e.g. the techniques of patterning, etching, and metal deposition described above in association with fabrication of vias 618.

Once the vias 718 have been provided, the superconducting layer 720 may be patterned, forming e.g. features 724, 726, and 728 as shown in FIG. 7D, similar to features 624, 626, and 628 described above.

Yet another implementation is shown in FIGS. 8A-8D, also illustrating implementation of box 408 of the method shown in FIG. 4, but according to a third embodiment of the present disclosure.

FIGS. 8A and 8B are similar to FIGS. 7A and 7B described above, in that, first, a superconducting layer 820 is provided over the SOI layer 810. Next, the superconducting layer 820 is patterned, forming e.g. features 824, 826, and 828 as shown in FIG. 8C, similar to features 624, 626, and 628 described above. The vias 818 are formed last, extending from the surfaces 822 of the first and second interconnects 824 and 828, respectively, to the lower interconnect 806.

Structures comprising below-plane interconnects as described herein allow providing interconnects which are superconducting and mechanically stable, while minimizing losses to spurious TLS's surrounding the interconnects.

Figure 9:
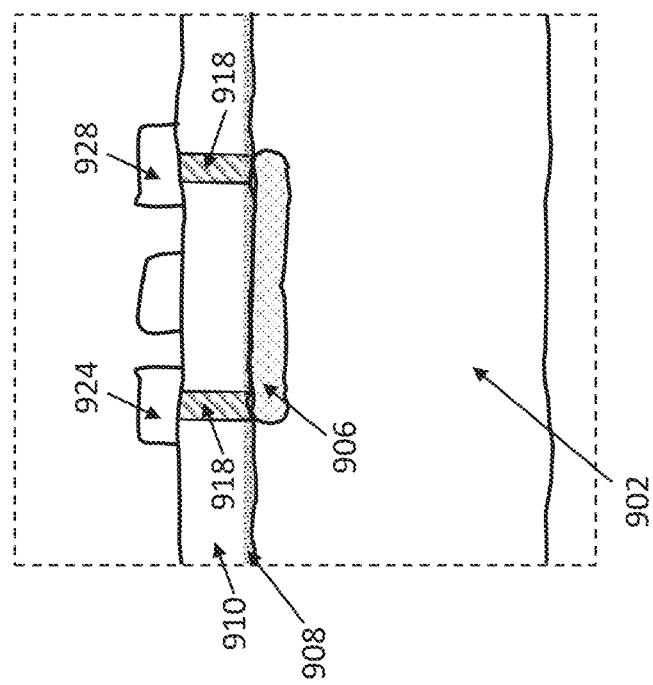
FIG. 9 provides a schematic illustration of a structure comprising an interconnect below the qubit plane, according to some embodiments of the present disclosure.

FIG. 9 provide a schematic illustration of a cross-section 900 of a structure comprising a lower interconnect 906 below the qubit plane, according to some embodiments of the present disclosure. As can be seen, FIG. 9 is drawn to reflect example real world process limitations, in that the features are not drawn with precise right angles and straight lines. As shown, FIG. 9 represents a cross-section view similar to that shown in FIGS. 6D, 7D, and 8D. FIG. 9 illustrates a substrate or an interconnect support layer 902, the lower interconnect 906 embedded therein by conventional patterning, a thin layer of oxide 908, a SOI layer 910, vias 918 for providing electrical interconnection between the lower interconnect 906 and each of the first and second interconnects 924 and 928, as could be visible in e.g. a scanning electron microscopy (SEM) image or a transmission electron miscroscope (TEM) image of a structure comprising the below-plane interconnect 906. In such an image of a real structure, possible processing defects could also be visible, such as e.g. tapered vias, occasional screw, edge, or combination dislocations within the crystalline Si region, occasional dislocation defects of single atoms or clusters of atoms.

Some Examples in accordance with various embodiments of the present disclosure are now described.

Example 1 provides a structure for providing electrical connectivity in a quantum circuit including a plurality of superconducting qubits provided over an interconnect support layer. The structure includes a first and a second interconnects of the quantum circuit, each of the first and the second interconnects provided over an upper surface of the structure, a lower interconnect provided below the upper surface of the structure; a first via providing electrical interconnection between the first interconnect and the lower interconnect; and a second via providing electrical interconnection between the second interconnect and the lower interconnect. Such a structure could be referred to as a "metallization stack."

Example 2 provides the structure according to Example 1, where the lower interconnect is provided at a distance between 50 nanometers (nm) and 100 micrometers (micron), e.g. between 50 nm and 50 micron, from the upper surface of the structure.

Example 3 provides the structure according to Examples 1 or 2, further including a layer of dielectric material between the lower interconnect and the upper surface of the structure, the layer of dielectric material having losses in a microwave spectrum being below a predefined threshold.

Example 4 provides the structure according to Example 3, where the layer of dielectric material between the lower interconnect and the upper surface of the structure includes crystalline silicon bonded to a surface of the interconnect support layer.

Example 5 provides the structure according to any one of the preceding Examples, where at least a portion of the material of the interconnect support layer provided below the lower interconnect includes silicon, alumina, or GaAs.

Example 6 provides the structure according to any one of the preceding Examples, where the first interconnect, the second interconnect, and the lower interconnect include one or more of superconductive materials.

Example 7 provides the structure according to Example 6, where the one or more of superconductive materials includes one or more of aluminium (Al), niobium (Nb), niobium nitride (NbN), titanium nitride (TiN), or niobium titanium nitride (NbTiN).

Example 8 provides the structure according to any one of Examples 1-7, where the first interconnect and the second interconnect include different ground lines of a single microwave interconnect of the quantum circuit. Thus, the lower interconnect provides an alternative to having a grounding strap provided as an air-bridge over the signal line of such a microwave interconnect.

Example 9 provides the structure according to any one of Examples 1-7, where the first interconnect and the second interconnect include different portions of a single line of a single microwave interconnect of the quantum circuit. Thus, the lower interconnect provides the possibility for having a resonator, flux bias line, or a microwave line that intersects (i.e. crosses) another one of resonator, flux bias line, or a microwave line of a quantum circuit without making electrical connection between the intersecting parts.

Example 10 provides the structure according to any one of the preceding Examples, where the each of the first interconnect and the second interconnect is a microwave coplanar waveguide (CPW).

Example 11 provides the structure according to any one of the preceding Examples, where the first via and the second via are provided substantially perpendicularly to the surface of the interconnect support layer.

In another Example, a structure could be provided comprising the lower interconnect below the qubit plane without the vias electrically connecting the lower interconnect to any parts in the qubit plane because such electrical connection could be made e.g. at the edge of the interconnect support layer in the plane of the lower interconnect. In yet another Example, instead of the first and second vias connecting the lower interconnect to the interconnects in the qubit plane as described above, one or more vias could be provided electrically connecting the lower interconnect to one or more interconnects in a plane below the lower interconnect (e.g. at the bottom of the interconnect support layer/substrate). In general, the lower interconnect as described herein could be electrically connected to one or more interconnects in any of the qubit plane, the plane of the lower interconnect, and below the plane of the lower interconnect.

Example 12 provides a quantum integrated circuit package, including a structure for providing electrical connectivity in a quantum circuit including a plurality of superconducting qubits provided over an interconnect support layer, the structure including a first and a second interconnects of the quantum circuit, each of the first and the second interconnects provided over an upper surface of the structure, a lower interconnect provided below the upper surface of the structure, a first via providing electrical interconnection between the first interconnect and the lower interconnect, and a second via providing electrical interconnection between the second interconnect and the lower interconnect; and the plurality of superconducting qubits provided over the upper surface of the structure.

In a further example, the first and the second interconnects, the lower interconnect, and the first and the second vias together form a structure according to any one of the Examples above.

Example 13 provides the quantum integrated circuit package according to Example 12, where the plurality of superconducting qubits includes transmon qubits.

Example 14 provides the quantum integrated circuit package according to Examples 12 or 13, where each of the plurality of superconducting qubits includes one or more Josephson Junctions.

Example 15 provides the quantum integrated circuit package according to Example 13, where each of the one or more Josephson Junctions includes a base electrode layer, a top electrode layer, and a tunnel barrier layer provided between the base electrode layer and the top electrode layer.

Example 16 provides a quantum computing device, including one or more integrated circuit packages according to any one of Examples 12-15.

Example 17 provides the quantum computing device according to Example 16, further including a cryogenic apparatus configured to maintain the plurality of superconducting qubits at a cryogenic temperature during operation of the plurality of superconducting qubits.

Example 18 provides a method for fabricating a quantum circuit package, the method including: patterning a lower interconnect on or over a first substrate; bonding the first substrate with an inverted second substrate, where the second substrate includes a silicon on insulator (SOI) layer; removing a portion of the second substrate until a surface of the SOI layer is exposed; providing a first and a second interconnects over the surface of the SOI layer; providing a first via enabling electrical interconnection between the first interconnect and the lower interconnect; and providing a second via enabling electrical interconnection between the second interconnect and the lower interconnect.

Example 19 provides the method according to Example 18, where, prior to the bonding, each of the lower interconnect and the SOI layer includes a layer of silicon oxide configured to promote the bonding of the first substrate with the inverted second substrate.

Example 20 provides the method according to Examples 18 or 19, where bonding includes thermal bonding at temperatures between 100 and 500 degrees Celsius.

Example 21 provides the method according to any one of Examples 18-20, where the Sal layer has a thickness between 50 nanometers and 100 micrometers.

Example 22 provides the method according to any one of Examples 18-21, where providing the first and the second interconnects and the first and the second vias includes: providing the first and the second vias extending from the exposed surface of the SOI layer to the lower interconnect; providing a layer of a superconductive material over at least a portion of the exposed surface of the SOI layer to the lower interconnect and in electrical contact with the first and the second vias; and patterning the layer of the superconductive material to form the first and the second interconnects.

Example 23 provides the method according to any one of Examples 18-21, where providing the first and the second interconnects and the first and the second vias includes providing a layer of a superconductive material over at least a portion of the exposed surface of the SOI layer; providing the first and the second vias extending from a surface of the layer of the superconductive material to the lower interconnect; and patterning the layer of the superconductive material to form the first and the second interconnects so that the first via extents between the first interconnect and the lower interconnect and the second via extends between the second interconnect and the lower interconnect.

Example 24 provides the method according to any one of Examples 18-21, where providing the first and the second interconnects and the first and the second vias includes providing a layer of a superconductive material over at least a portion of the exposed surface of the SOI layer; patterning the layer of the superconductive material to form the first and the second interconnects; and providing the first and the second vias extending from, respectively, the first and the second interconnects to the lower interconnect.

Example 25 provides the method according to any one of Examples 18-24, further including after the first and the second interconnects and the first and second vias are formed, providing a plurality of superconducting qubits over the surface of the structure.

Example 26 provides the method according to Example 25, where the plurality of superconducting qubits includes transmon qubits.

Example 27 provides the method according to Examples 25 or 26, where each of the plurality of superconducting qubits includes one or more Josephson Junctions.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A quantum device, comprising:
   a lower interconnect provided in an opening in an interconnect support layer;
   a layer of crystalline silicon;
   a bonding layer, configured to bond the layer of crystalline silicon to the interconnect support layer so that a portion of the bonding layer is between the lower interconnect and the layer of crystalline silicon;
   one or more qubit devices over the layer of crystalline silicon;

a first and a second interconnects for the one or more qubit devices, each of the first and the second interconnects provided over the layer of crystalline silicon;

a first via, configure to provide electrical connection between the first interconnect and the lower interconnect; and a second via, configure to provide electrical connection between the second interconnect and the lower interconnect.

2. The quantum device according to claim 1, wherein the lower interconnect is at a distance between 50 nanometers (nm) and 100 micrometers (micron) from a plane of the one or more qubit devices.

3. The quantum device according to claim 1, wherein at least a portion of the interconnect support layer comprises silicon, alumina, or GaAs.

4. The quantum device according to claim 1, wherein each of the first interconnect, the second interconnect, and the lower interconnect includes one or more of superconductive materials.

5. The quantum device according to claim 4, wherein the one or more of superconductive materials include one or more of aluminium (Al), niobium (Nb), niobium nitride (NbN), titanium nitride (TiN), or niobium titanium nitride (NbTiN).

6. The quantum device according to claim 1, wherein the first interconnect and the second interconnect comprise different ground lines of a single microwave interconnect for the one or more qubit devices.

7. The quantum device according to claim 1, wherein the first interconnect and the second interconnect comprise different portions of a single line of a single microwave interconnect for the one or more qubit devices.

8. The quantum device according to claim 1, wherein the each of the first interconnect and the second interconnect is a coplanar waveguide (CPW).

9. The quantum device according to claim 1, wherein the first via and the second via are substantially perpendicular to the interconnect support layer.

10. A quantum device, comprising:
a structure for providing electrical connectivity in a quantum circuit comprising a plurality of superconducting qubits provided over an interconnect support layer, the structure comprising:
a first and a second interconnects of the quantum circuit, each of the first and the second interconnects provided over an upper surface of the structure,
a lower interconnect provided below the upper surface of the structure,
a layer of crystalline silicon between the upper surface of the structure and the lower interconnect,
a bonding layer between the layer of crystalline silicon and the lower interconnect,
a first via providing electrical interconnection between the first interconnect and the lower interconnect, and
a second via providing electrical interconnection between the second interconnect and the lower interconnect; and
the plurality of superconducting qubits provided over the upper surface of the structure.

11. The quantum device according to claim 10, wherein the plurality of superconducting qubits comprises transmon qubits.

12. The quantum device according to claim 10, wherein each of the plurality of superconducting qubits comprises one or more Josephson Junctions.

13. The quantum device according to claim 11, wherein each of the one or more Josephson Junctions comprises a base electrode layer, a top electrode layer, and a tunnel barrier layer provided between the base electrode layer and the top electrode layer.

14. The quantum device according to claim 1, wherein the bonding layer includes an oxide material.

15. The quantum device according to claim 1, wherein the quantum device is a quantum computing device.

16. The quantum device according to claim 10, wherein the bonding layer includes an oxide material.

17. The quantum device according to claim 10, wherein the quantum device is a quantum computing device.

18. A quantum device, comprising:
an interconnect support structure;
a lower interconnect provided in an opening in the interconnect support structure or over the interconnect support structure;
a layer of crystalline silicon;
a bonding layer, configured to bond the layer of crystalline silicon over the interconnect support structure so that a portion of the bonding layer is between the lower interconnect and the layer of crystalline silicon;
one or more qubit devices over the layer of crystalline silicon;
a first and a second interconnects for the one or more qubit devices, each of the first and the second interconnects provided over the layer of crystalline silicon;
a first via, configure to provide electrical connection between the first interconnect and the lower interconnect; and
a second via, configure to provide electrical connection between the second interconnect and the lower interconnect.

19. The quantum device according to claim 18, wherein each of the first interconnect, the second interconnect, and the lower interconnect includes one or more of superconductive materials.

20. The quantum device according to claim 18, wherein the bonding layer includes an oxide material.

* * * * *